United States Patent
Bezama et al.

(10) Patent No.: US 6,900,073 B2
(45) Date of Patent: May 31, 2005

(54) FAST FIRING FLATTENING METHOD AND APPARATUS FOR SINTERED MULTILAYER CERAMIC ELECTRONIC SUBSTRATES

(75) Inventors: Raschid J. Bezama, Mahopac, NY (US); Renee L. Weisman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,429

(22) Filed: Apr. 8, 2003

(65) Prior Publication Data

US 2004/0203184 A1 Oct. 14, 2004

(51) Int. Cl.⁷ ............................................. H01L 21/44
(52) U.S. Cl. .................................... 438/106; 156/89.15
(58) Field of Search ................................ 438/106, 109; 156/89.15

(56) References Cited

U.S. PATENT DOCUMENTS

| | | | |
|---|---|---|---|
| 5,182,121 A | | 1/1993 | Miyashita et al. |
| 5,496,433 A | | 3/1996 | Miyashita et al. |
| 5,932,043 A | * | 8/1999 | Bates et al. .............. 156/89.15 |
| 6,721,163 B2 | * | 4/2004 | Iwase et al. ............. 361/301.4 |

* cited by examiner

Primary Examiner—David Nelms
Assistant Examiner—Quoc Hoang
(74) Attorney, Agent, or Firm—DeLio & Peterson, LLC; Peter W. Peterson; Ira D. Blecker

(57) ABSTRACT

An apparatus for flattening sintered ceramic electronic packaging substrates having opposing faces with undesired camber interleaves the substrates with spacers. At least one heating zone includes a heat transfer medium movable toward and away from the stack of interleaved ceramic substrates and spacers to apply a desired rate of heat by direct contact with or close proximity to sides of the stack. A plunger applies pressure to the stack in a direction normal to the faces of the substrates. At least one cooling zone includes a heat transfer medium movable toward and away from the stack to remove heat introduced in the heating zone by direct contact with or close proximity to sides of the stack. A reducing gas supply is operatively connected to the at least one heating zone and at least one cooling zone to supply gas to maintain a controlled reducing atmosphere within the apparatus.

20 Claims, 5 Drawing Sheets

FAST FIRING FLATTENING METHOD AND APPARATUS FOR SINTERED MULTILAYER CERAMIC ELECTRONIC SUBSTRATES

BACKGROUND OF INVENTION

1. Field of the Invention

The present invention relates to a method and apparatus for flattening sintered multilayer ceramic electronic substrates used in the production of microelectronic chips.

2. Description of Related Art

State-of-the-art flattening in a continuous furnace for alumina single chip module (SCM) multilayer ceramic (MLC) products involve the use of molybdenum boats, typically with five to six layers to carry product. Each boat layer can carry 16 to 36 products depending on how much weight each product must see to obtain an acceptable final flatness. Typically, four to nine reference products would be placed under one flattening weight, and four such weights would be loaded in a given boat layer. A typical flattening process requires heating the samples under a 0.2–0.5 kg weight (about 1000–3000 Pa) to over 1400° C. and then maintaining them at high temperature for about one hour to achieve an acceptable process yield, under existing flatness specification levels. Typical heating rates are 2–4° C./min, with a lower rate for cooling. The process operating temperature is selected to exceed the ceramic liquid phase melting point to facilitate flattening. Since the processing conditions during flattening do not involve any throughput-limiting chemical reaction, but need only to keep some moderate control on temperature gradient in the loading boat, usual boat loading frequencies fall in the 20–30 min range, resulting in a total processing time of 16 to 20 hours for a typical continuous furnace.

Typically, post sintering process specifications for flatness require top surface camber or flatness of less than 30 $\mu$m in the chip site area to enable reliable and-efficient chip joining process, and less than 75 to 125 $\mu$m on the product bottom surface to enable second level interconnect processes, such as ball grid array (BGA), land grid array (LGA) or pins. Since the total boat weight is usually limited by the furnace design characteristics, and the flattening weight per product is set by the level of product rework required, it is generally not possible to maximize the tool throughput arbitrarily. However, for the reference product type and typical rework level requirements, it is possible to expect the tool throughput to be in the 4000 to 8000 samples/day range.

Additional flattening steps are used when one flattening pass is not sufficient to bring the product into the desired flatness range, but the efficiency of the process decreases with every additional processing step mainly due to continuous dissolution of alumina into the ceramic liquid phase during maximum heating temperature, which results in a more refractory liquid phase. Also, with such additional processing steps, the product size continues to decrease due to sintering, increasing the chance that the product falls below size specification range. From a mechanical point of view, the use of a fixed flattening load on a given product is also expected to reduce in effectiveness as the products get flatter since the given load is distributed onto an increasingly larger area. Further, surface contamination problems such as glassy vials and fused ceramic are likely to increase due to interaction between the product and the flattening hardware at the process operating temperature.

The need to maximize furnace throughput to control processing costs drives the practice of loading many products under a given weight during flattening. However, not all products have the same level of out-of-flatness after sintering; consequently not all products see the same level of flattening in a typical processing tool. Thus, state-of-the-art flattening processes are not expected to improve the distribution of flatness on a given product batch, but may sometimes increase the measurement data dispersion while simultaneously reducing the average flatness of a product batch.

Alumina MLC yields, unit cost, and reliability are directly dependent on product dimensional control. But the increasing package design complexity, driven by the increasing chip complexity and performance, has increased significantly the difficulties in maintaining product dimensions below existing specs. Furthermore, design pitch enhancements for future products will increase the challenge to design and manufacturing sectors, particularly driven by the need to reduce the local camber in the chip-site area below 25 $\mu$m. The current process to resolve this problem is to flatten the products, but the existing process and tool used to flatten these products are inefficient and somewhat capacity limited.

SUMMARY OF INVENTION

Bearing in mind the problems and deficiencies of the prior art, it is therefore an object of the present invention to provide an improved method and apparatus for flattening sintered multilayer ceramic substrates used for production of microelectronic chips.

It is another object of the present invention to provide a method and apparatus for flattening sintered multilayer ceramic substrates which have improved, i.e., faster, product throughput.

A further object of the invention is to provide a method of flattening sintered multilayer ceramic substrates which utilizes lower maximum temperatures.

It is yet another object of the present invention to provide a method and apparatus for flattening sintered multilayer ceramic substrates which improve the distribution of flatness for a given product batch.

It is a further object of the present invention to provide an apparatus for flattening sintered ceramic multilayer substrates which takes less production space.

A further object of the present invention is to provide a method and apparatus which reduce the rework previously required to flatten sintered multilayer ceramic substrates.

It is yet another object of the present invention to provide a method and apparatus for flattening sintered multilayer ceramic substrates which reduce gas and power usage.

The above and other objects and advantages, which will be apparent to one of skill in the art, are achieved in the present invention which is directed to, in a first aspect, a method for flattening sintered ceramic electronic packaging substrates comprising providing a plurality of sintered ceramic electronic packaging substrates having opposing faces with undesired camber. The ceramic substrates have a length and width and a thickness between the faces substantially less than the ceramic substrate length and width. The method also includes providing a plurality of spacers having a length and width at least as great as the length and width of the ceramic substrates, and a thickness substantially less than the spacer length and width. The spacers further have a thermal conductivity at least as great as a thermal conductivity of the ceramic substrates. The method then comprises stacking the ceramic substrates and spacers such that the spacers are disposed between each of the ceramic substrates, and providing a heat transfer medium along sides of the stack of the ceramic substrates and spacers. The heat transfer medium has an inside length and width substantially equal to the spacer length and width. The method further comprises applying heat to sides of the stacked ceramic substrates and spacers via the heat transfer medium to a maximum temperature not exceeding liquidus or softening temperature of the ceramic substrates, applying pressure to the stacked ceramic substrates and spacers in a direction normal to the faces of the ceramic substrates while maintaining the maximum temperature to reduce the camber of the ceramic substrate faces, and cooling the ceramic substrates and maintaining reduced camber of the substrate faces.

Preferably, the method includes moving the heat transfer medium sufficiently close to the sides of the stacked ceramic substrates and spacers to heat the stack at a rate of at least 4° C./s. The heat transfer medium may be placed in substantial heat is applied to all sides of the stacked ceramic substrates and spacers via the heat transfer medium. The method may further include heating and cooling the stacked ceramic substrates and spacers in a controlled atmosphere of less than 5% by volume hydrogen.

The spacers employed may comprise a metal such as copper, iron, molybdenum, tungsten and alloys thereof, optionally coated with a layer of a ceramic. The spacers may alternatively comprise a ceramic or ceramic-ceramic alloy, such as alumina, aluminum nitride, silicon carbide and multiphase ceramic or ceramic-metal composites thereof, optionally coated with a layer of a ceramic.

Pressure is preferably applied starting at a minimum level, with an increase by at least 20 percent above the minimum level to a maximum pressure at the time maximum temperature of the ceramic substrates is maintained.

Preferably, the method further includes providing a furnace having a preheating zone, a processing zone, and a cooling zone. The stacked ceramic substrates and spacers are placed in the pre-heating zone for applying the heat, are thereafter moved to the process zone for maintaining the maximum temperature, and subsequently moved to the cooling zone for cooling. The method may also include a plurality of stacked ceramic substrates and spacers, wherein the plurality of stacked ceramic substrates and spacers are present in the pre-heating zone, processing zone, and cooling zone, and are moved continuously therethrough.

The spacers preferably have a length and width greater than the length and width of the ceramic substrates. The heat may be applied at least partially by conduction from the heat transfer medium to the spacers, and during cooling, the heat may be removed at least partially by conduction from the spacers to the heat transfer medium. The heat transfer medium may comprise a plurality of walls in at least partial contact with the spacers, with at least one wall being movable with respect to the stacked ceramic substrates and spacers. The heat transfer medium may also comprise a heat source for applying the heat to the spacers. The method may include applying the heat to the spacers through the plurality of walls at least partially by conduction and permitting the at least one wall to move with respect to the stacked ceramic substrates and spacers as a result of thermal forces during the heating and cooling. There may be further provided a plunger in contact with an end of the stacked ceramic substrates and spacers. In addition to applying heat to the stacked ceramic substrates and spacers, the walls may guide the plunger to apply pressure to the stacked ceramic substrates and spacers. Preferably, an end of the plunger extends above the walls by a dimension of at least the total camber of the stack ed ceramic substrates.

In another aspect, the present invention is directed to an apparatus for flattening a stack of interleaved sintered ceramic electronic packaging substrates and spacers, wherein the ceramic substrates having opposing faces with undesired camber. The apparatus comprises at least one heating zone including a heat transfer medium movable toward and away from the stack of interleaved ceramic substrates and spacers to apply a desired rate of heat by direct contact with or close proximity to sides of the stack. The heating zone further includes a plunger for applying pressure to the stack of interleaved ceramic substrates and spacers in a direction normal to the faces of the substrates. The apparatus also comprises at least one cooling zone including a heat transfer medium movable toward and away from the stack of interleaved ceramic substrates and spacers to remove heat introduced in the at least one heating zone by direct contact with or close proximity to sides of the stack. The apparatus further comprises a reducing gas supply operatively connected to the at least one heating zone and at least one cooling zone to supply gas to maintain a controlled reducing atmosphere within the apparatus. The apparatus may include a stack of interleaved sintered ceramic electronic packaging substrates and spacers in the at least one heating zone, wherein the heating zone includes a heating source having a thermal mass at least 5 times greater than thermal mass of the stack of interleaved ceramic substrates and spacers.

Preferably, the apparatus includes a first heating zone for receiving and preheating the stack of interleaved ceramic substrates and spacers and a separate, second heating zone for further heating the stack of interleaved ceramic substrates and spacers after passing from the first heating zone. More preferably, the apparatus is adapted to process stacks of interleaved ceramic substrates and spacers in the at least one heating zone and the at least one cooling zone simultaneously.

More preferably, the heating zone includes a heating source having i) a high thermal conductivity thermal reservoir containing a heating element and ii) a replaceable high thermal conductivity contact member secured to the thermal reservoir for transferring heat from the thermal reservoir to the stack of interleaved ceramic substrates and spacers. The contact member is resistant to mechanical stress induced by rapid heat transfer between the thermal reservoir to the stack.

The heat transfer media in the heating zone and the cooling zone may comprise a plurality of side members adapted to contact and transfer heat to or from all sides of the stack of interleaved ceramic substrates and spacers. Preferably, the side members in the heating zone may be adapted to guide the plunger as it applies pressure to the stack of interleaved ceramic substrates and spacers. More preferably, an end of the plunger extends above the side members by a dimension of at least the total camber of the stacked ceramic substrates.

The heat transfer medium in the heating zone may comprise a first side wall secured to a base, and a removable second side wall opposite the first side wall, such that when the stack of interleaved ceramic substrates and spacers is disposed on the base, the first and second side walls are adapted to apply heat to opposite sides of the stack of interleaved ceramic substrates and spacers. Preferably, each of the side walls form an L shape when viewed in a direction normal to the base, such that when the stack of rectangular, interleaved ceramic substrates and spacers is disposed on the base, the first and second side walls are adapted to apply heat to all sides of the stack of interleaved ceramic substrates and spacers. The walls in the heating zone may be adapted to make at least partial contact along sides of the stack of interleaved ceramic substrates and spacers. At least one heating block is movable toward and away from the walls, so that spacing between the heating block and the walls is adjustable to vary the amount of heat transferred to the walls, and the walls then apply heat to the stack of interleaved ceramic substrates and spacers at least partially by conduction.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which

DETAILED DESCRIPTION

Figure 1:
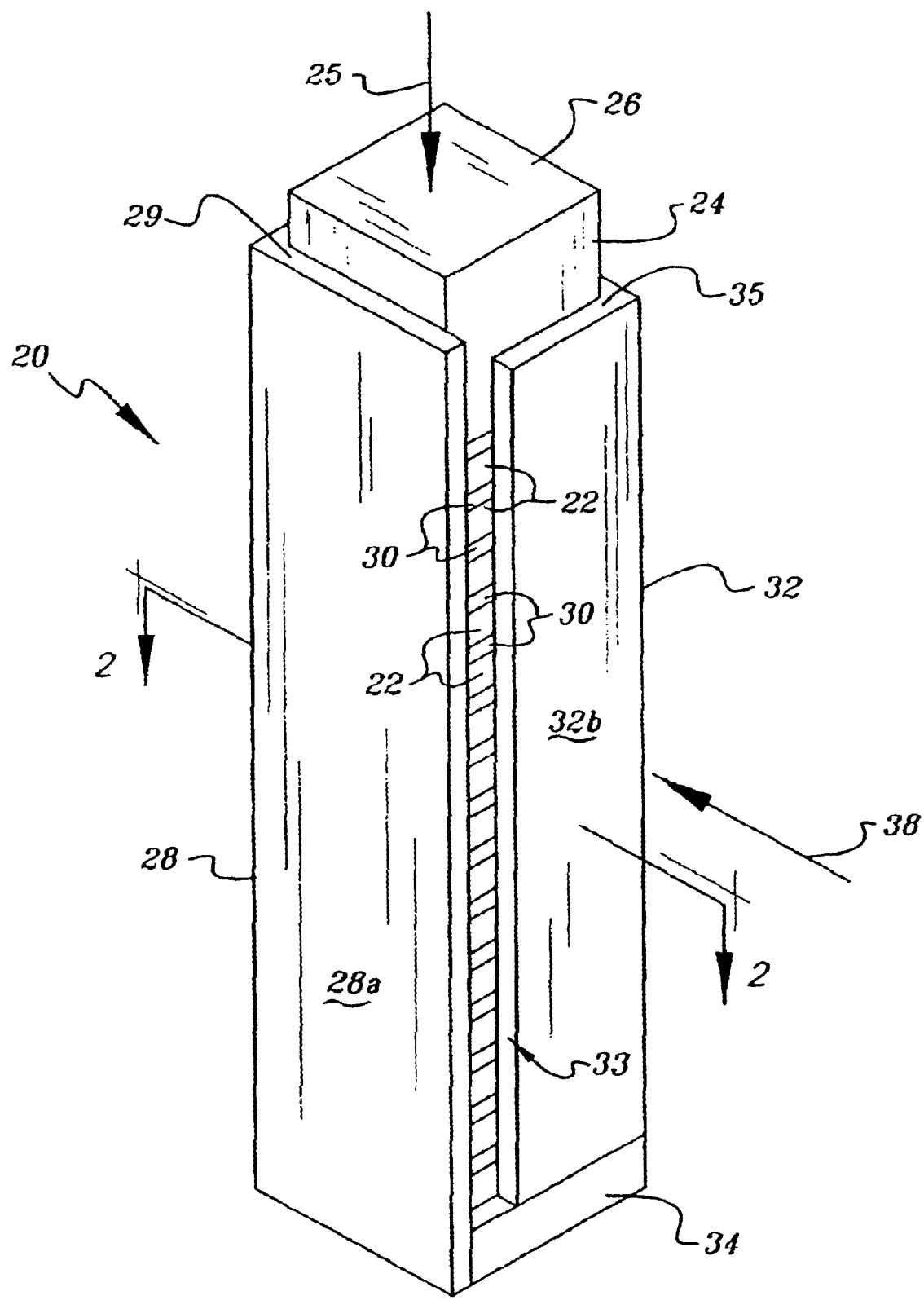
FIG. 1 is a perspective view of the preferred product carrier of the present invention which receives the stacked sintered multilayer ceramic substrates for flattening.

In describing the preferred embodiment of the present invention, reference will be made herein to FIGS. 1–8 of the drawings in which like numerals refer to like features of the invention. Features of the invention are not necessarily shown to scale in the drawings.

The process and apparatus described herein provide flattening capability for sintered ceramic MLC and other products at relatively high tool throughput rate, short processing time, and low processing unit cost, relative to existing state-of-the-art flattening. The description of tooling and processing capabilities herein uses as an example a typical 44 mm sintered alumina SCM MLC substrate product, 3 mm thick. However, the throughput of the apparatus described herein is directly dependent on product size. Also, since batch and continuous furnace processes are typically used in known flattening processes, and may be used with the process and apparatus of the present invention, it is preferred that a continuous furnace process be employed.

Figure 2:
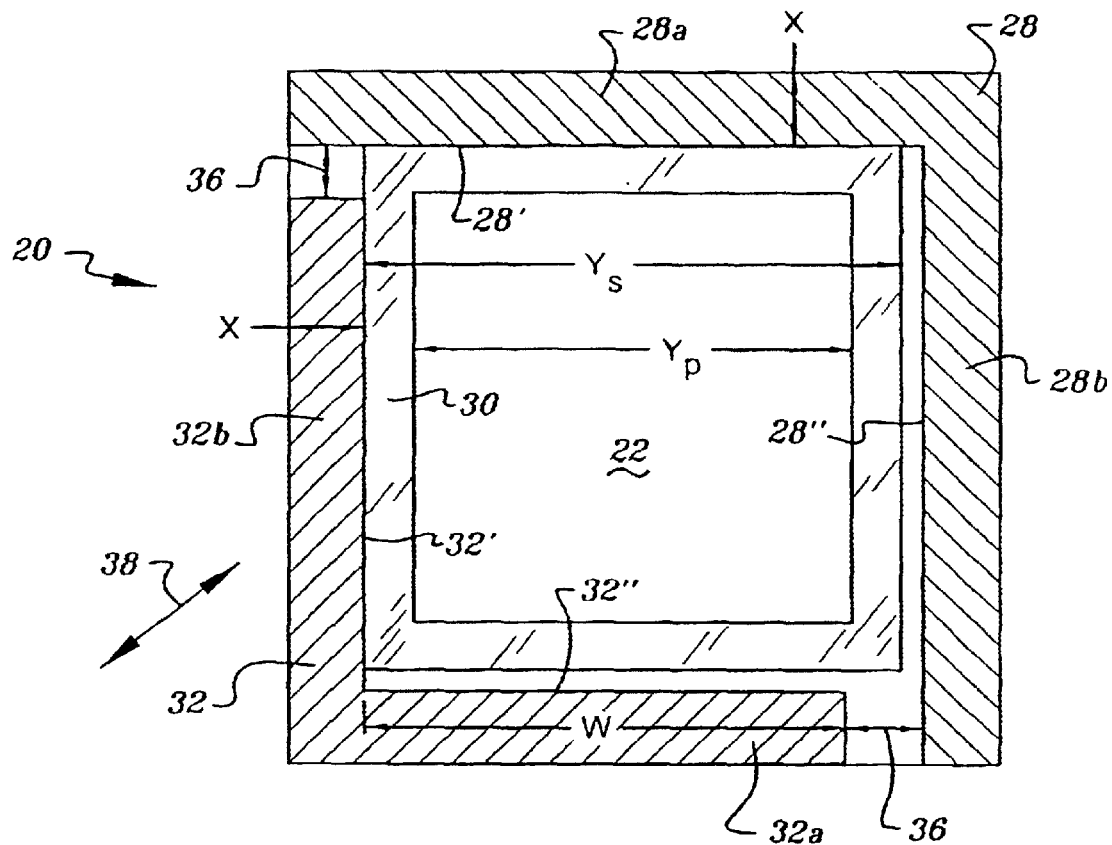
FIG. 2 is cross-sectional view of the product carrier of FIG. 1 showing a sintered multilayer ceramic substrate and interleaved spacer within the heat transfer medium walls of the product carrier.

The preferred embodiment of the present invention employs for the flattening process a continuous furnace and product carrier that travels through the furnace. The preferred product carrier or boat 20 is depicted in FIGS. 1 and 2, and includes three separate elements: a fixed carrier member 28 attached to base 34, a product stack locator member 32 movable horizontally toward the product stack in the direction shown by arrow 38, and product plunger 24 movable vertically in the direction shown by arrow 25. Product stack 33 is shown disposed on base 34 between carrier members 28 and 32, and below plunger 24. The fixed carrier member and base, the movable stack locator member, and the product plunger are preferably made of a thermally conductive metal or alloy. Molybdenum and tungsten are the preferred materials to build the different carrier components, primarily because these materials have adequate thermo-mechanical properties and are easier to machine than ceramic composites. Fixed carrier member 28 is secured to horizontal base plate 34 and consists of two adjacent side support walls 28a, 28b (FIG. 2), which are joined at a right angle and form an L shape as seen in top plan view. The fixed carrier sidewalls are preferably at least 3 mm thick (dimension x, FIG. 2) to have sufficient mechanical strength and help the transfer of thermal energy to and from the furnace into product stack 33. Product stack locator member 32 consists of two plates 32a, 32b joined at a right angle forming an L shape in top plan view, or a single plate bent to get the same shape, with wall thickness also preferably at least 3 mm thick (dimension x, FIG. 2). The stack locator wall width should be made to match the width of the smallest spacer to be used in the given carrier, as will be discussed further below. Since product stack 33 does not need to be fully enclosed in the carrier, but needs to be supported partially from all four sides, this particular type of carrier can service a range of spacer sizes. The top end 29 of fixed carrier member 28 is shown as being above the top end 35 of product stack locator member 32, but the height of these ends may be the same or reversed.

Carrier 20 may accommodate more than one product size, at different times, and is shown holding a single stack 33 of sintered ceramic substrate products 22 separated by spacers 30, preferably of slightly larger length and width. The preferred carrier has a relatively small horizontal cross-section, e.g., less than about 9 in.$^2$ (60 cm$^2$) as opposed to about 144 in.$^2$ (900 cm$^2$) for current boats, to optimize heat transfer. The preferred carrier can accommodate between 60 and 100 substrates, depending on the furnace dimensions.

Figure 3:
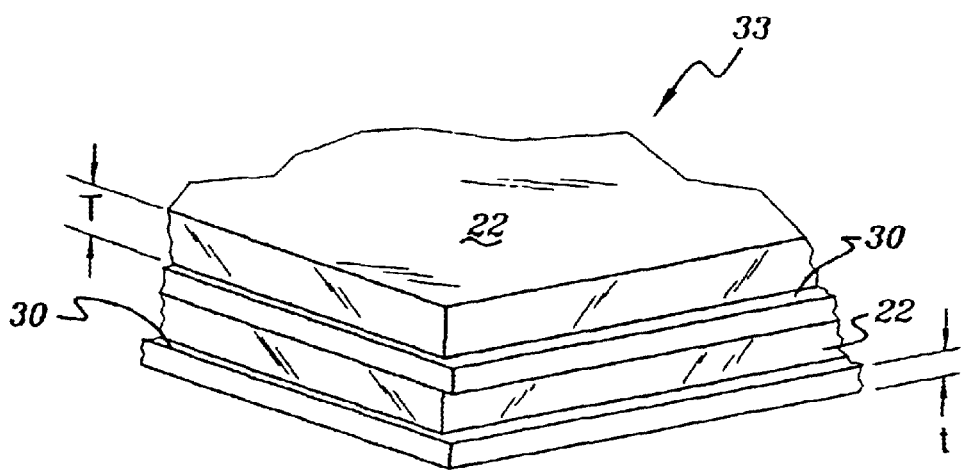
FIG. 3 is a perspective view of a portion of the stack of interleaved sintered multilayer ceramic substrates and spacers.

Although the sintered ceramic substrates and spacers are depicted in FIGS. 1, 2 and 3 as being square or rectangular, any desired configuration may be employed. The ceramic substrates 22 have opposing top and bottom faces, and a thickness between the faces substantially less than the length and/or the width of the substrates. Likewise spacers 30 have opposing top and bottom faces and a thickness between the faces substantially less than the length and/or width of the spacer. As shown in FIG. 3, the thickness T of the sintered ceramic substrate 22 and thickness t of the spacer may vary but preferably the thickness t of the spacer is less than that of the substrate in order to maximize the amount of sintered ceramic substrate product which can be processed within a given product carrier at one time. In stacking the spacers and ceramic substrates, it is preferred that one spacer is disposed between each two substrates, and likewise each substrate is disposed between two spacers so that the faces of each are disposed adjacent the other, to create the fully interleaved stack 33. However, more than one spacer may be disposed adjacent each face of each of the ceramic substrates.

As shown most clearly in FIG. 2, the L shaped walls 28a, 28b of fixed carrier side member 28 and the L shaped walls 32a, 32b of movable carrier side member 32 are positioned on opposite sides of the interleaved stack 33 of sintered ceramic substrates and spacers. The inner faces 28' and 28" of side wall 28 are at least partially in contact with the edges of spacer 30 and likewise the inner faces 32' and 32" of side wall 32 are at least partially in contact with the edges of spacer 30. As shown, face 32' and face 28' are in direct contact with the adjacent edges of spacer 32 whereas faces 28" and 32" are slightly spaced apart from the adjacent edges of spacer 30. Members 28 and 32 comprise a heat transfer medium which transfer heat from an external heater, discussed further below, to the stack of interleaved ceramic substrates and spacers. While the heat transfer between the sidewall members 28, 32 to the stack is largely by radiation, the direct contact of the walls with the spacers facilitates conductive heat transfer as well. Members 28 and 32 also serve to transfer heat out of the product stack during cooling, as will also be discussed further below.

The preferred spacer dimensions are dependent on the dimensions of the ceramic substrate product to be flattened. Spacer 30 is shown having width $y_S$ and substrate product 22 is shown having width $y_P$. While the length or width of the spacer is preferably at least that of the length or width of the substrate, it is preferred that both the length and width of the spacer be larger than the corresponding length and width of the sintered ceramic substrate. Preferably, the length and width of the spacer is about 0.5–1.0 mm larger than the product length and width dimensions to maximize the product thermal uniformity during flattening. However, larger increases in spacer length and width dimensions are possible when the product is relatively thin and/or the spacer is relatively thick. Spacers 30 should also have a higher thermal conductivity than the ceramic substrates to provide an acceptably low thermal gradient. Spacer thickness and material are preferably optimized to deliver the thermal gradient control needed by the product during the flattening process, but a minimum of 1 mm thickness is more preferred to provide sufficient mechanical stability. Greater spacer thickness improves the product thermal gradient during processing, but decreases the furnace capacity. Thermal optimization may be easily done with the help of any known, commercially available thermal simulation program.

Spacers 30 may be made of a metal or alloy such as copper, iron, molybdenum or tungsten, or alloys of these metals with other elements, or may be made of a ceramic such as alumina, aluminum nitride, silicon carbide, or their multiphase ceramic or ceramic-metal composites. Preferably, the spacer is coated on both faces with a layer of a ceramic such as alumina.

So that product carrier 20 may accommodate a variety of spacer lengths and widths, the width of the individual stack locator walls 32a, 32b should be no greater than the width and length of the smallest spacer expected to be used with the ceramic substrates. As shown in FIG. 2, width w of stack locator wall 32a is less than width $y_S$ of spacer 30. Similarly, the width of wall 32b is less than the length of spacer 30. This leaves spaces 36 between the adjacent vertical edges of members 28 and 32. Thus, the movement in direction 38 of the stack locator member 32 with respect to fixed carrier member 28 may accommodate different size ceramic substrates and spacers, as well as vary the distance between the carrier sidewalls 28a, 28b, 32a, 32b and the edges of the spacers 30.

After the product stack 33 is loaded into the carrier 20 and partially enclosed between fixed carrier member 28 and movable stack locator member 32, stack plunger 24 is placed on top of the stack to complete the carrier assembly. Plunger 24 is guided in its vertical movement up and down by the top portions of members 28 and 32, and preferably has a top surface or end 26 that protrudes out of and above the top ends 29, 35 of the carrier sidewalls by a minimum distance defined by the product stack tolerances, carrier tolerances, and level of flattening needed by the product. For example, a carrier with 100 products in the product stack, and an average out-of-flatness of 50 μm, can shrink a maximum of 5 mm in height if compressed to achieve zero out-of-flatness. Assuming that 2 mm are needed to take care of carrier and product tolerances, the plunger height should be selected to protrude by an additional amount, e.g., at least 7 mm above the higher end 29 of the carrier sidewalls. An otherwise conventional piston driven system (not shown) applies force to the top surface 26 of the plunger.

Figure 4:
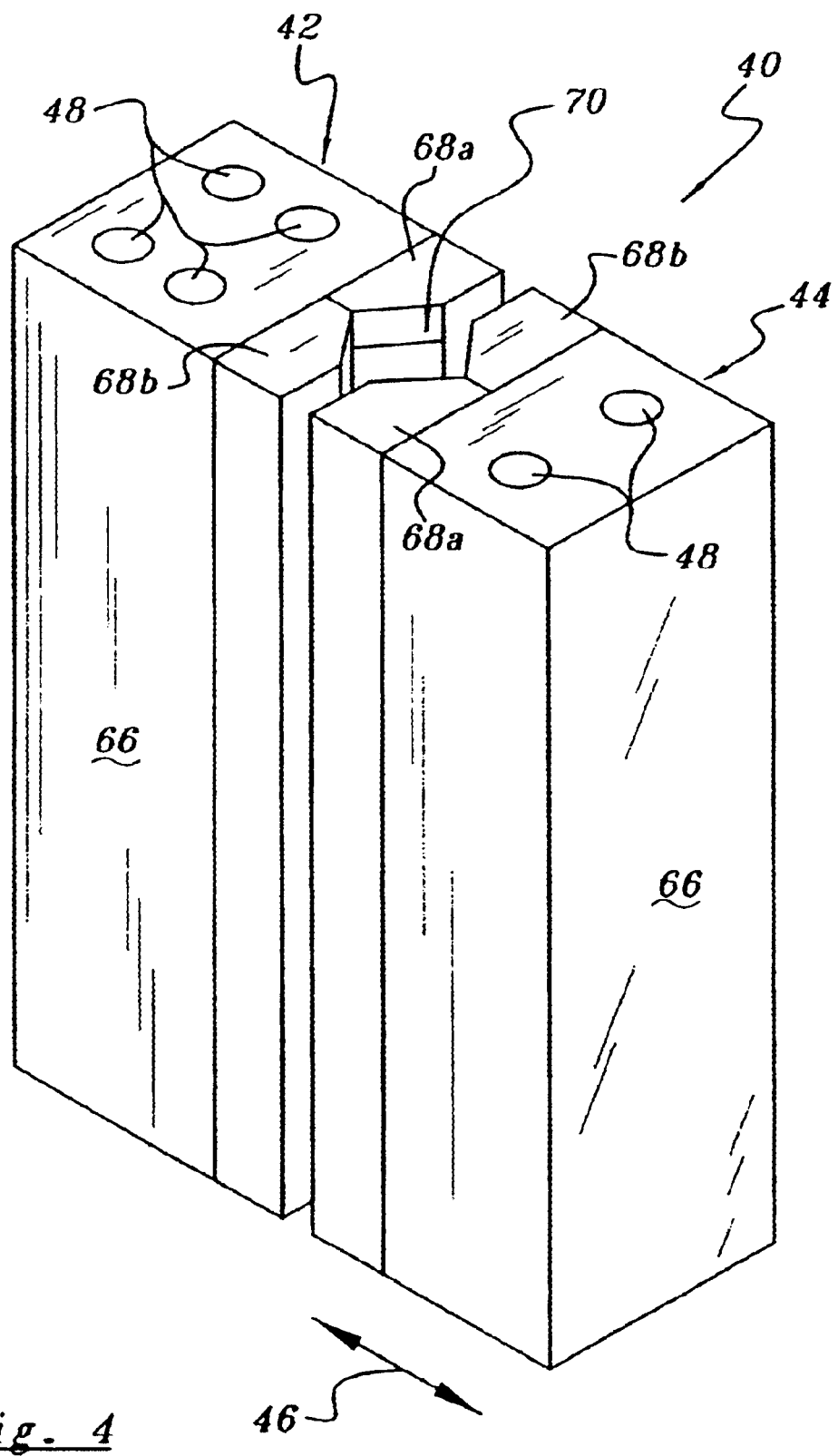
FIG. 4 is perspective view of the preferred heater for applying heat to the product carrier of FIG. 1, whose basic configuration is also used in the product carrier cooler.
Figure 7:
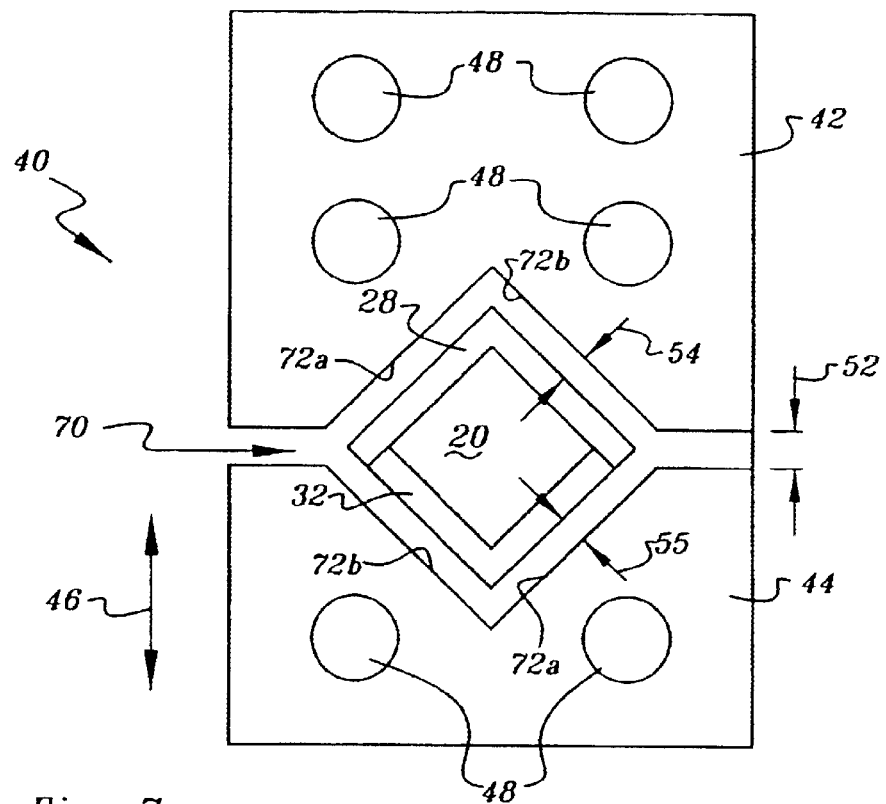
FIG. 7 is a top plan view of the heater/cooler of FIG. 4 and within it, the product carrier of FIG. 1.
Figure 8:
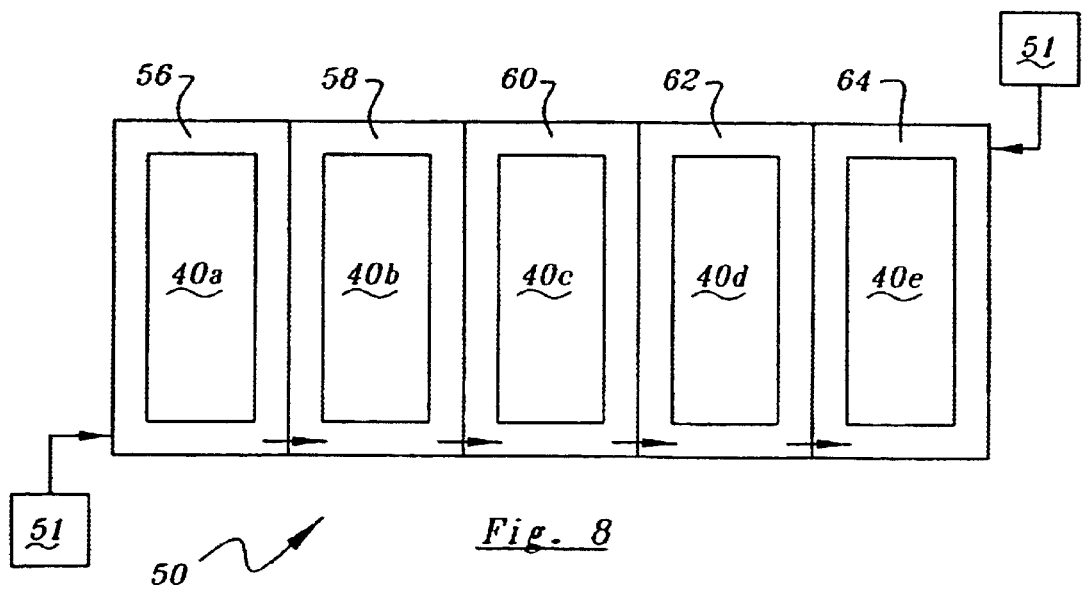
FIG. 8 is a cross sectional view of a furnace showing the progression of a plurality of heaters/coolers through the different chambers of the furnace.

Carrier 20, after loading stack 33 and assembly, is then loaded into a furnace with heaters preferably machined to match the carrier shape. A preferred heater 40 is shown in FIGS. 4–7, and comprises a pair of heater blocks 66 containing cylindrical electric heating elements 48 or other heat source, and a contact head made up of contact head sections 68a, 68b in thermal contact therewith. Each heating block 66 may include a thermostat or other means (not shown) to control its temperature at a preselected level. As shown in FIGS. 4 and 7, at least one of the heating blocks, section 44, is movable towards and away from the other heating block, section 42, in the direction of arrow 46. This permits carrier 20 to be placed in opening 70 between both heating blocks (FIG. 7). When the heating block sections 42, 44 are closed around product carrier, there may be a gap 52 between the sections, or the sections may contact each other. For maximum carrier heating rate, both heating blocks should be placed in close proximity to the product carrier, or in direct contact, whenever possible. In addition to the preselected temperature setting for a given heating block, by increasing or decreasing the gaps 54 and/or 55 (FIG. 7) between product carrier 20 and the heating blocks, the furnace has an additional way to modulate or control the boat heating rate to any predefined rate.

Figure 5:
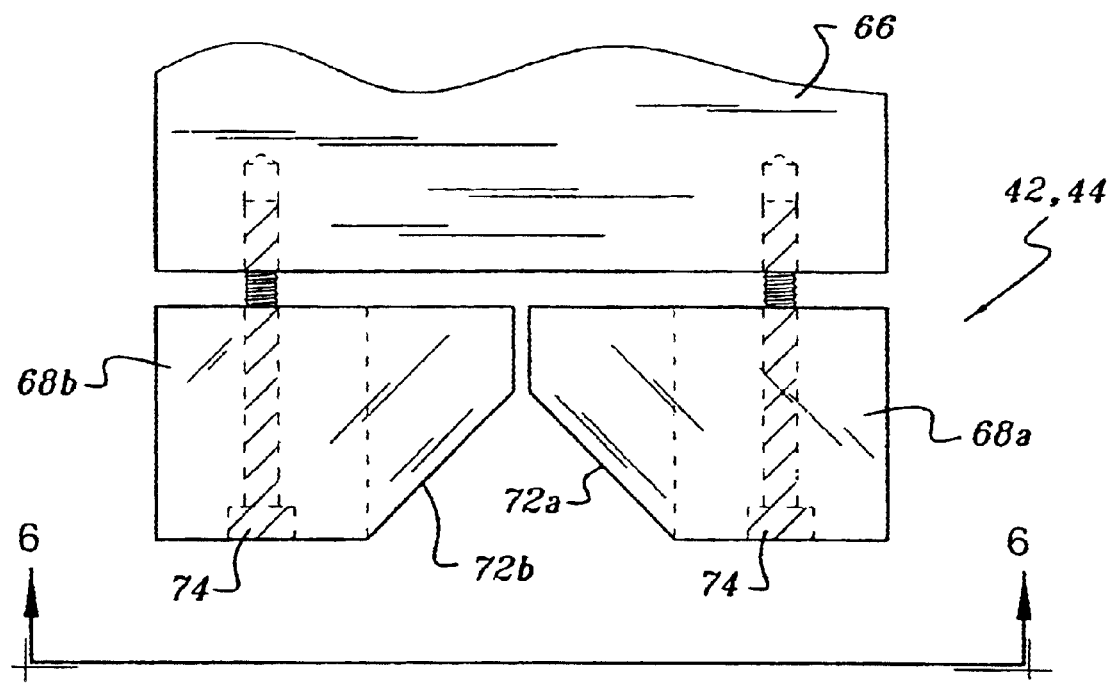
FIG. 5 is a cross-sectional view partially exploded, of the heating/cooling blocks in the heater depicted in FIG. 4, and along the section line 5—5 of FIG. 6.
Figure 6:
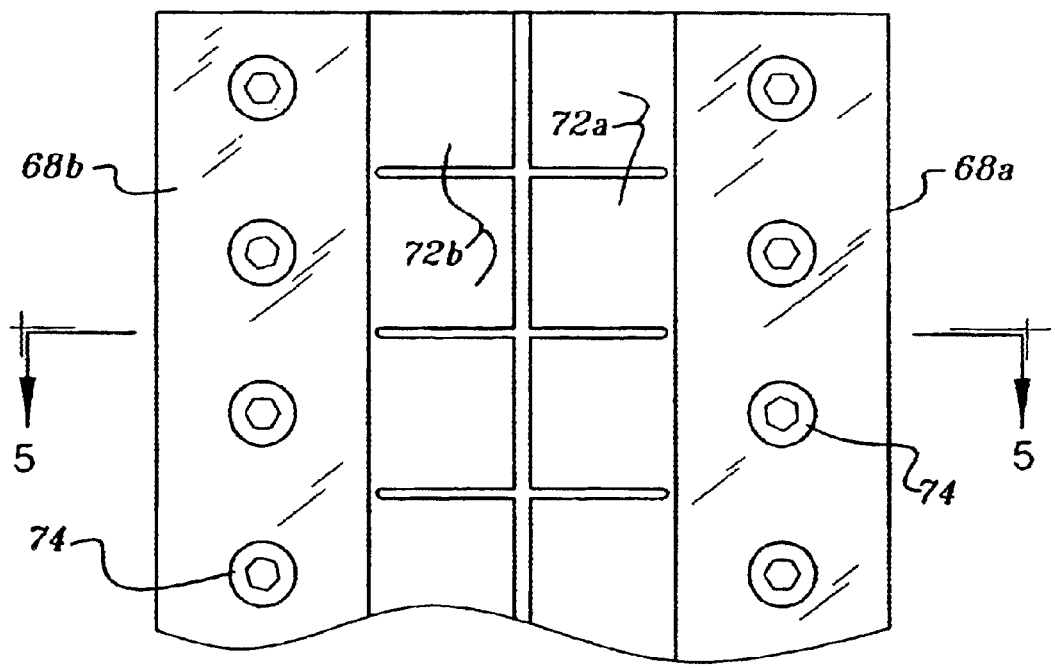
FIG. 6 is an elevational view showing the faces of the heating/cooling block of FIG. 5, along lines 6—6.

While it is possible to build a heater block out of a single material piece as shown in FIG. 7, it is preferred to fabricate each block with two distinct sections, a heater section, and a contact head, as shown in FIGS. 4 and 5. Each heater block section 42, 44 may be made from one or more pieces to assemble a solid block with openings extending vertically there through where cylindrical heating elements 48 can be inserted, as shown in FIGS. 4 and 7. The heater block sections can be made from any material with relatively high intrinsic thermal conductivity, such as molybdenum, tungsten, silicon carbide, and aluminum nitride.

Likewise, the contact head sections can be made from any of the above material having relatively high intrinsic thermal conductivity, but are preferably made from molybdenum or tungsten. It has been found that the contact head should be designed to tolerate large thermal transients, and it is preferred that it be built with short segments aligned to the thermal gradients that will develop during normal operation, so that they are free to expand and contract on the side which faces the product carrier. Contact head sections 68a, 68b, may be made from one or more pieces to assemble a block with a face to contact the heating block and other face to receive and contact the product carrier. As shown in FIG. 5, contact heads 68a, 68b are secured to heating block 66 of heating elements 42, 44 by fasteners 74. Contact head faces 72a, 72b form opening 70 between the heater blocks and contact, or have a small gap 54 separating them from, the sides of product carrier 20 (FIG. 7). Faces 72a, 72b and opening 70 preferably conform closely to the configuration of the exterior sides of product carrier 20. To accommodate different size product carriers, the widths of faces 72a, 72b are preferably no greater than the smallest respective exterior width and length of the product carrier loaded with a product stack.

As an alternative to a separate heater and product carrier, heating elements 42, 44 may be secured directly to the fixed carrier member 28 and movable product stack locator member 32, respectively, so that carrier members 28 and 32 more directly act as heat sources to the product stack therein.

To provide cooling to the product carrier and the stack of interleaved ceramic substrates and spacers therein, a cooling unit may be made in identical fashion to heater 40, except for the heating elements. As shown in FIGS. 4 and 7, cooler 40 instead has cooling elements 48 which comprise fluid cooling passages or other well known cooling means which remove heat from product carrier 20. Thus, in a manner analogous to that described for the heaters, faces 72a, 72b of cooler 40 may be positioned closely adjacent to or in direct contact with the sidewalls of carrier members 28 and 32 to remove heat from product stack 33 therein.

The heaters and coolers containing the product carriers and product stacks are preferably placed in a continuous furnace for processing. The preferred continuous furnace of the present invention includes at least three thermal sections, i.e., two for heating and one for cooling, connected to individually controlled heating or cooling power elements, and loading and unloading sections. In the furnace 50 shown in FIG. 8, there are two heating zones 56, 58, followed by a process zone 60, and two cooling zones 62, 64. Separate heaters 40a, 40b, 40c and coolers 40d, 40e, each containing a loaded product carrier, are shown in the different furnace zones. Furnace process zone 60, in addition heater 40c, also includes the piston or other means to apply a controlled vertical load to the carrier plunger, including both a load and displacement sensors (not shown). An extra zone may be added to the cooling section to compensate for the fact that heating is inherently more efficient than cooling. Gas supply 51 provides a protective gas inside furnace 50, preferably a reducing atmosphere. Other furnace elements not shown but needed for the normal furnace operation include insulation between heating zones, loading and unloading stations, provisions for handling the reducing gas inside the furnace, and mechanisms for timing and transporting the product carriers and heaters from one zone to the next. These furnace elements are well known and may be obtained commercially from furnace suppliers.

In all zones, the heating and cooling processes in the preferred furnace are based on conduction and radiation mechanisms. The primary mechanism is substantially solid-to-solid conduction, with radiation to help heat transfer across any gaps between solids. This heating and cooling method, while combined with the small cross-section product carrier configuration, allows heating/cooling rates in excess of 4° C./second without creating excessive thermal gradients in the ceramic substrate product. To verify this, a detailed thermal model of the carrier of the present invention was built using existing thermal modeling code. The heating time constant for a product carrier to carry a ceramic substrate product of the type shown her ein has been estimated to be about 50 seconds, thus enabling a 5 minutes per zone processing. Extra heating and cooling zones provide additional flexibility to the process engineer to tailor a desired temperature profile while minimizing product carrier thermal gradients, and enable the furnace to operate at a 5 minutes loading capability. A furnace with 6 zones, 100 product carriers, and 5 minutes loading frequency can easily process 28,000 of the example sintered ceramic substrates per day, with a total processing time of 30 minutes for each product stack.

The maximum temperature for the product in the product stack is preferably below the lowest liquidus temperature of any of the phases of the ceramic substrates, or below the softening temperature of the ceramic substrate. The softening temperature is understood in this industry to be the temperature at which the viscosity drops below $10^{7.6}$ poise.

With regard to applied pressure, by way of example, for an alumina-based ceramic substrate product of dimensions 44 mm width by 44 mm length and 2 mm thickness, and depending on product characteristics and out-of-flatness level, a load of 50 kg applied at 1350° C. for 5 minutes will be sufficient to reduce consistently any global camber below 50 $\mu$m and local chip-site camber below 15 $\mu$m. By keeping the product at this lower maximum temperature it is possible to reduce significantly the levels of cross-contamination seen on the product surface due to transfer of liquid phase matter between the flattening tiles and the product. The increase in flattening load is more than sufficient to compensate for the increase in resistance to deformation of the alumina phase at this lower operating temperature, mainly because the deformation dependency on load was found experimentally to be nonlinear for the example alumina product. With this flattening method, all samples in the product stack were found to see approximately the same flattening load. Since the flattening rate is typically high initially and then decreases as the individual sample gets flatter when using a fixed flattening load, there is a natural trend to equalize the resulting camber of a given batch of products, hence reducing the camber variability of the product batch. If there is a need to further improve the batch variability, a loading profile can be used instead of a fixed load, with the load starting at a minimum level and increasing by 20 to 50 percent during the time the boat is in the process zone.

In operation, after the sintered ceramic substrate product and spacers are interleaved and stacked within the product carrier, the product carrier is loaded into the heater. Inside the furnace, the carrier is preferably heated by substantially direct contact between the carrier walls and the heater thermal storage unit to achieve a heating rate greater than 4° C./second, as opposed to 2–4° C./minute maximum rate typical in current systems. At the highest temperature point, the furnace piston driven system pushes the carrier plunger and applies about 90N or more force to the stack of interleaved sintered ceramic substrates and spacers to overcome viscous deformation forces and flatten the individual sintered ceramic substrate products. This translates to a pressure across the faces of the ceramic substrates of at least about 100,000 Pa. The pressure preferably increases during the processing, so that it increases from an initial pressure of, for example, 100,000 Pa by at least 20 percent to a pressure of, for example, 100,000 Pa at maximum processing temperature. The maximum temperature and pressure are maintained for a time sufficient to flatten the sintered ceramic substrates, and may be determined without undue experimentation. For the example shown herein, maximum temperature and pressure are typically maintained for 5 minutes. The carrier configuration of the present invention permits a flattening force regime that is 50 to 100 times higher than loads typically applied in current systems, and employs a maximum temperature seen by the alumina substrate products during flattening of 1350° C., which is more than 100° C. lower that typically employed in current systems.

Following flattening, the product carrier containing the product stack is transferred into a cooler, as described above, in the continuous furnace cooling section, and the cooling elements cool the product stack while pressure is maintained and gradually reduced. Both the heating and cooling process are preferably run in a reducing gas environment, e.g., less than 5 volume percent $H_2$ concentration, with a low dew point, e.g., less than 45° C., and relatively low flow rate requirements. Subsequently, the product carrier is removed from the cooler, and the product stack is unloaded from the carrier. The operation is continuous, so that separate heaters and coolers containing different product carriers and product stacks are processed simultaneously.

Thus, the present invention provides an improved method and apparatus for flattening sintered multilayer ceramic substrates used for production of microelectronic chips, which has faster product throughput while utilizing lower maximum temperatures. The distribution of flatness for a given product batch is improved, while at the same time reducing the amount of rework previously required. The apparatus of the present invention also takes less production space and reduces gas and power usage.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for flattening sintered ceramic electronic packaging substrates comprising:
   providing a plurality of sintered ceramic electronic packaging substrates having opposing faces with undesired camber, the ceramic substrates having a length and width and a thickness between the faces substantially less than the ceramic substrate length and width;
   providing a plurality of spacers having a length and width at least as great as the length and width of the ceramic substrates, and a thickness substantially less than the spacer length and width, the spacers further having a thermal conductivity at least as great as a thermal conductivity of the ceramic substrates;
   stacking the ceramic substrates and spacers such that the spacers are disposed between each of the ceramic substrates;
   providing a heat transfer medium along sides of the stack of the ceramic substrates and spacers, the heat transfer medium having an inside length and width substantially equal to the spacer length and width;
   applying heat to sides of the stacked ceramic substrates and spacers via the heat transfer medium to a maximum temperature not exceeding liquidus or softening temperature of the ceramic substrates;
   applying pressure to the stacked ceramic substrates and spacers in a direction normal to the faces of the ceramic substrates while maintaining the maximum temperature to reduce the camber of the ceramic substrate faces; and
   cooling the ceramic substrates and maintaining reduced camber of the substrate faces.

2. The method of claim 1 including moving the heat transfer medium sufficiently close to the sides of the stacked ceramic substrates and spacers to heat the stack at a rate of 4° C./s.

3. The method of claim 1 including placing the heat transfer medium in substantial contact with the sides of the stacked ceramic substrates and spacers.

4. The method of claim 1 wherein heat is applied to all sides of the stacked ceramic substrates and spacers via the heat transfer medium.

5. The method of claim 1 wherein the spacers comprise a metal.

6. The method of claim 1 wherein the spacers comprise a metal coated with a layer of a ceramic.

7. The method of claim 1 wherein the spacers comprise a metal selected from the group consisting of copper, iron, molybdenum, tungsten and alloys thereof.

8. The method of claim 1 wherein the spacers comprise a ceramic or ceramic-ceramic alloy coated with a layer of ceramic.

9. The method of claim 1 wherein the spacers comprise a ceramic selected from the group consisting of alumina, aluminum nitrate, silicon carbide and multiphase ceramic or ceramic-metal composites thereof.

10. The method of claim 1 further including providing a furnace having a preheating zone, a processing zone, and a cooling zone, and wherein the stacked ceramic substrates and spacers are placed in the pre-heating zone for applying the heat, the stacked ceramic substrates and spacers are thereafter moved to the process zone for maintaining the maximum temperature, and the stacked ceramic substrates and spacers are thereafter moved to the cooling zone for cooling.

11. The method of claim 1:
   including providing a furnace having a pre-heating zone, a processing zone, and a cooling zone, wherein the stacked ceramic substrate and spacers are moved to the pre-heating zone for applying the heat, the stacked ceramic substrates and spacers are thereafter moved to the process zone for maintaining the maximum temperature, and the stacked ceramic substrates and spacers are thereafter moved to the cooling zone for cooling, and further including a plurality of stacked ceramic substrates and spacers, wherein the plurality of stacked ceramic substrates and spacers are present in the pre-heating zone, processing zone, and cooling zone, and are moved continuously there thorough.

12. The method of claim 1 wherein the pressure is applied starting at a minimum level, with an increase by at least 20 percent above the minimum level to a maximum pressure at the time maximum temperature of the ceramic substrates is maintained.

13. The method of claim 1 wherein the spacers have a length and width greater than the length and width of the ceramic substrates.

14. The method of claim 1 wherein the heat is applied at least partially by conduction from the heat transfer medium to the spacers.

15. The method of clam 1 wherein during cooling, the heat is removed at least partially by condition from the spacers to the heat transfer medium.

16. The method of claim 1 wherein the heat transfer medium comprises a plurality of walls in at least partial contact with the spacers, at least one wall being movable with respect to the stacked ceramic substrates and spacers, and including applying the heat to the spacers through the plurality of walls at least partially by conduction and permitting the at least one wall to move with respect to the stacked ceramic substrates and spacers as a result of thermal forces during the heating and cooling.

17. The method of claim 1 wherein the heat transfer medium comprises a plurality of walls in at least partial contact along sides of the sacked ceramic substrates and spacers and further including providing a plunger in contact with an end of the stacked ceramic substrates and spacers, the walls applying heat to the stacked ceramic substrates and spacers and guiding the plunger to apply pressure to the stacked ceramic substrates and spacers.

18. The method of claim 1 wherein the heat transfer medium comprises a plurality of walls in at least partial contact along sides of the stacked ceramic substrates and spacers and further including providing a plunger in contact with an end of the stacked ceramic substrates and spacers, the walls applying heat to the stacked ceramic substrates and spacers and guiding the plunger to apply pressure to the stacked ceramic substrates and spacers, an end of the plunger extending above the walls by a dimension of at least the total camber of the stacked ceramic substrates.

19. The method of claim 1 wherein the heat transfer medium comprises heat source for applying the heat to the spacers.

20. The method of claim 1 further including heating and cooling the stacked ceramic substrates and spacers in a controlled atmosphere of less than 5% by volume hydrogen.

* * * * *